(12) United States Patent
Chen

(10) Patent No.: US 6,927,984 B2
(45) Date of Patent: Aug. 9, 2005

(54) EXPANSION CARD RETENTION APPARATUS

(75) Inventor: Yun-Lung Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 23 days.

(21) Appl. No.: 10/654,244

(22) Filed: Sep. 2, 2003

(65) Prior Publication Data

US 2004/0170007 A1 Sep. 2, 2004

(30) Foreign Application Priority Data

Feb. 27, 2003 (TW) ........................ 92203132 U

(51) Int. Cl.⁷ ................................ H05K 7/12
(52) U.S. Cl. ................. 361/801; 361/732; 361/740; 361/759
(58) Field of Search ............... 361/726, 732, 361/740, 741, 747, 759, 801, 796, 797, 798; 312/223.2, 223.3

(56) References Cited

U.S. PATENT DOCUMENTS

| | | | |
|---|---|---|---|
| 5,317,483 A | | 5/1994 | Swindler |
| 5,601,349 A | | 2/1997 | Holt |
| 5,694,291 A | * | 12/1997 | Feightner .................... 361/683 |
| 5,757,618 A | * | 5/1998 | Lee ............................ 361/686 |
| 6,215,668 B1 | | 4/2001 | Hass et al. |
| 6,231,139 B1 | * | 5/2001 | Chen ........................ 312/223.2 |
| 6,320,752 B1 | * | 11/2001 | Jang ............................ 361/740 |
| 6,320,760 B1 | * | 11/2001 | Flamm et al. .............. 361/801 |
| 6,442,038 B1 | | 8/2002 | Erickson et al. ............ 361/759 |
| 6,515,867 B2 | * | 2/2003 | Sheng-Hsiung et al. .... 361/759 |
| 6,549,398 B2 | * | 4/2003 | Chen .......................... 361/683 |
| 6,700,791 B1 | * | 3/2004 | Zappacosta ................. 361/759 |

FOREIGN PATENT DOCUMENTS

TW           472906         1/2002

* cited by examiner

Primary Examiner—Kamand Cuneo
Assistant Examiner—Dameon E. Levi
(74) Attorney, Agent, or Firm—Wei Te Chung

(57) ABSTRACT

An expansion card retention apparatus includes a rear panel (30), a retention bracket (10) for attaching expansion cards (50) to the rear panel, and a thumbscrew (18). A bent plate (34) is bent perpendicularly outwardly from the rear panel. The retention bracket includes a first and a second plate (12, 14) joined at a common edge. A plurality of retention tabs (16) extends from the common edge, for restricting movement of the expansion cards in directions perpendicular to the rear panel when the first plate is in a locked position. The second plate engages with the expansion cards, for restricting movement of the expansion cards in directions parallel to the rear panel. A first and a second hook (321, 322) are formed inwardly from the rear panel, for movably clamping the first plate therebetween. The thumbscrew fixedly attaches the first plate to the rear panel in the locked position.

16 Claims, 6 Drawing Sheets

EXPANSION CARD RETENTION APPARATUS

BACKGROUND OF THE INVENTION

1. Field of the Invention

The present invention relates to a retention apparatus for computer systems, and more particularly to a retention apparatus for expansion cards of a computer.

2. Description of the Related Art

Microprocessor based computer systems typically require or include facilities for connecting one or more expansion cards to the system. Expansion cards extend the capabilities of computer systems by providing dedicated hardware to achieve a variety of tasks. Graphics adapters, high speed network controllers, hard disk controllers, sound cards, and modem cards are among some of the more common types of expansion cards, although those knowledgeable in the field of computer systems will recognize a wide variety of other types of expansion cards.

Typically, expansion cards are interfaced to the microprocessor (or microprocessors in a multi-processor system) by physically inserting the expansion card into an expansion card connector. In many cases, the expansion card comprises facilities for making an external connection to the expansion card. A network adapter card, as an example, typically comprises a socket for connecting an external cable to the adapter card. The expansion card must be maintained in a precise position such that the socket is accessible. Moreover, because external connections to expansion cards are achieved by incorporating expansion slots in an enclosure of a computer system, it is important to maintain the positioning of expansion cards within their respective expansion card connectors during system operation to insure reliable operation. Those familiar with expansion cards and expansion card connectors will appreciate the ease with which a slight displacement or movement of the expansion card can result in a faulty connection. Thus, maintaining precise positioning of expansion cards is an important issue in the design and manufacturing of computer systems. Historically, the secure positioning of expansion cards was maintained by screwing each expansion card into place with one or more securing screws. Unfortunately, the use of separate screws to secure each expansion card undesirably increases the amount of time and effort required to install, remove, replace, and otherwise service the expansion cards in a system.

A significant amount of effort has been devoted to simplifying the means by which the positioning of expansion cards is maintained. See for example U.S. Pat. No. 6,215,668, which teaches a complex retaining unit for securing an expansion card via the application of a wedging force; and Taiwan Pat. No. 472906, which discloses a slidable block and a support base mechanism for engaging expansion cards. Unfortunately, these inventions typically require highly intricate retention structures and a rotating or sliding mechanism, which introduces undesirably expensive extra hardware to the system component list.

SUMMARY OF THE INVENTION

Accordingly, an object of the present invention is to provide an expansion card retention apparatus which can conveniently attach an expansion card to a computer enclosure.

Another object of the present invention is to provide an easily manufactured and inexpensive expansion card retention apparatus.

To achieve the above objects, an expansion card retention apparatus in accordance with the present invention comprises a rear panel, a retention bracket, and a thumbscrew. A bent plate is bent perpendicularly outwardly from a lower portion the rear panel. An entry slot is thereby defined in the rear panel adjacent the bent plate. A plurality of spaced expansion slots is defined in the lower portion of the rear panel. A first hook and a second hook are inwardly formed at the lower portion adjacent the entry slot. A pair of vertically spaced third hooks is formed between the first and second hooks. The retention bracket comprises a first and a second plate joined at a common edge. A plurality of retention tabs extends away from the common edge, corresponding to the expansion slots of the rear panel. A pair of spaced slots is defined in the first plate, corresponding to the third hooks. The first plate is clamped between the first and second hooks, with the third hooks movably received in the slots of the first plate. The second plate of the retention bracket extends through the entry slot of the rear panel. In use, a plurality of expansion cards is aligned with the expansion slots of the rear panel respectively. End portions of slot covers of the expansion cards abut the bent plate of the rear panel. The retention bracket is slid toward the expansion cards, until the second plate engages with the end portions of the expansion cards, for restricting movement of the expansion cards in directions parallel to the rear panel, and the retention tabs abut insides respectively of the expansion cards adjacent the end portions, for restricting movement of the expansion cards in directions perpendicular to the rear panel. The thumbscrew fixedly attaches the retention bracket to the rear panel. The expansion cards are thus securely attached to the rear panel.

Other objects, advantages and novel features of the present invention will be drawn from the following detailed description of preferred embodiments of the present invention with the attached drawings, in which:

DESCRIPTION OF THE PREFERRED EMBODIMENT

Figure 1:
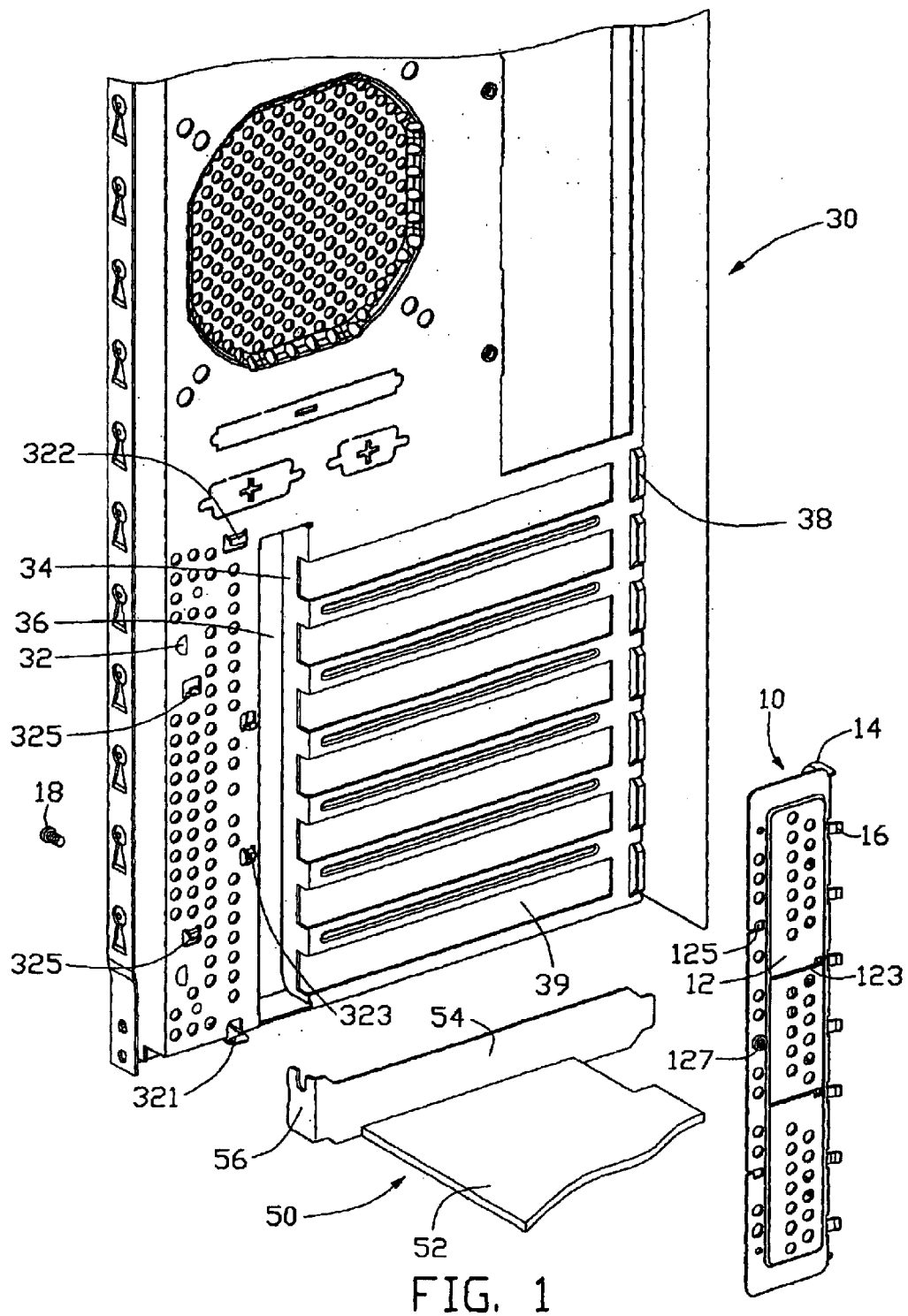
FIG. 1 is an exploded, isometric view of an expansion card retention apparatus in accordance with a preferred embodiment of the present invention together with an expansion card, the expansion card retention apparatus comprising a rear panel, a retention bracket and a thumbscrew.
Figure 2:
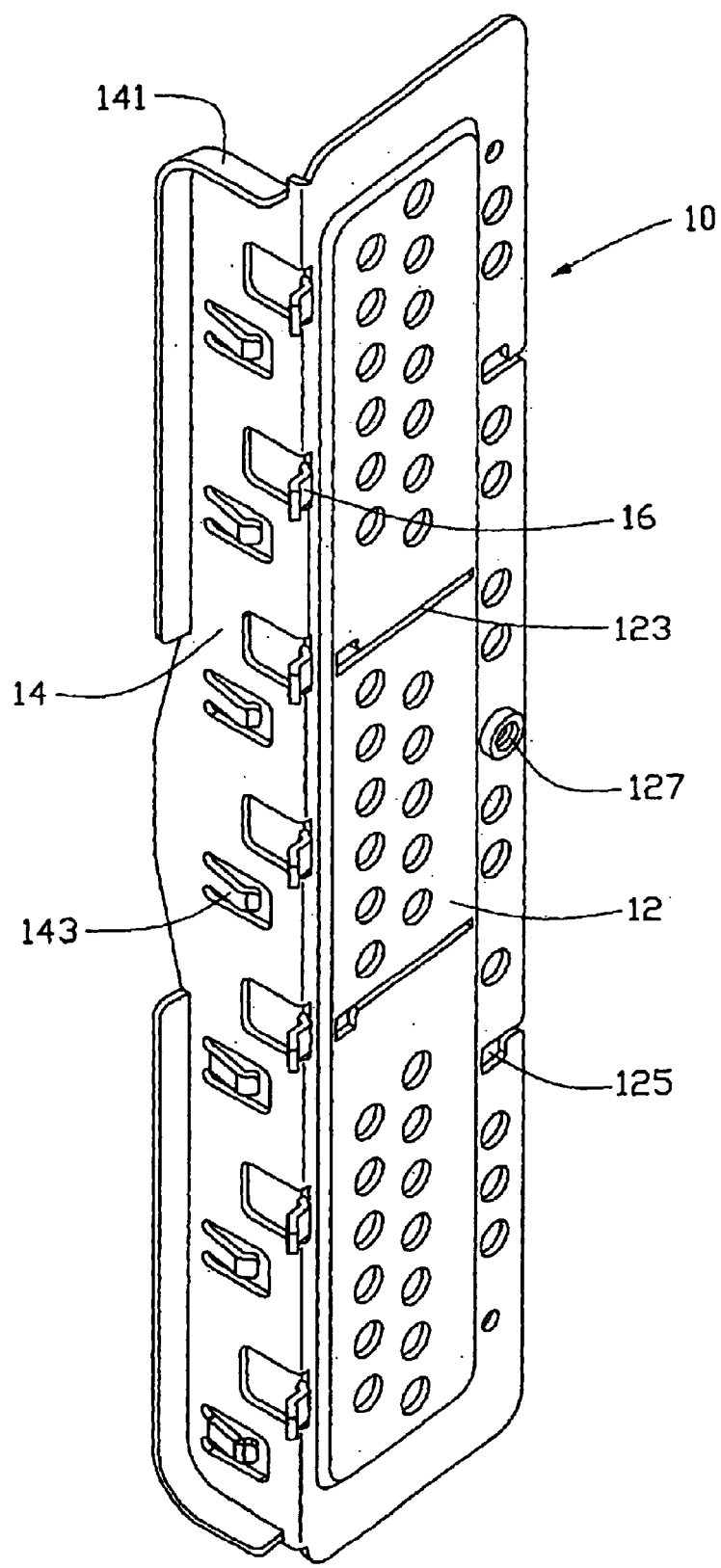
FIG. 2 is an enlarged view of the retention bracket of FIG. 1, but viewed from another aspect.
Figure 3:
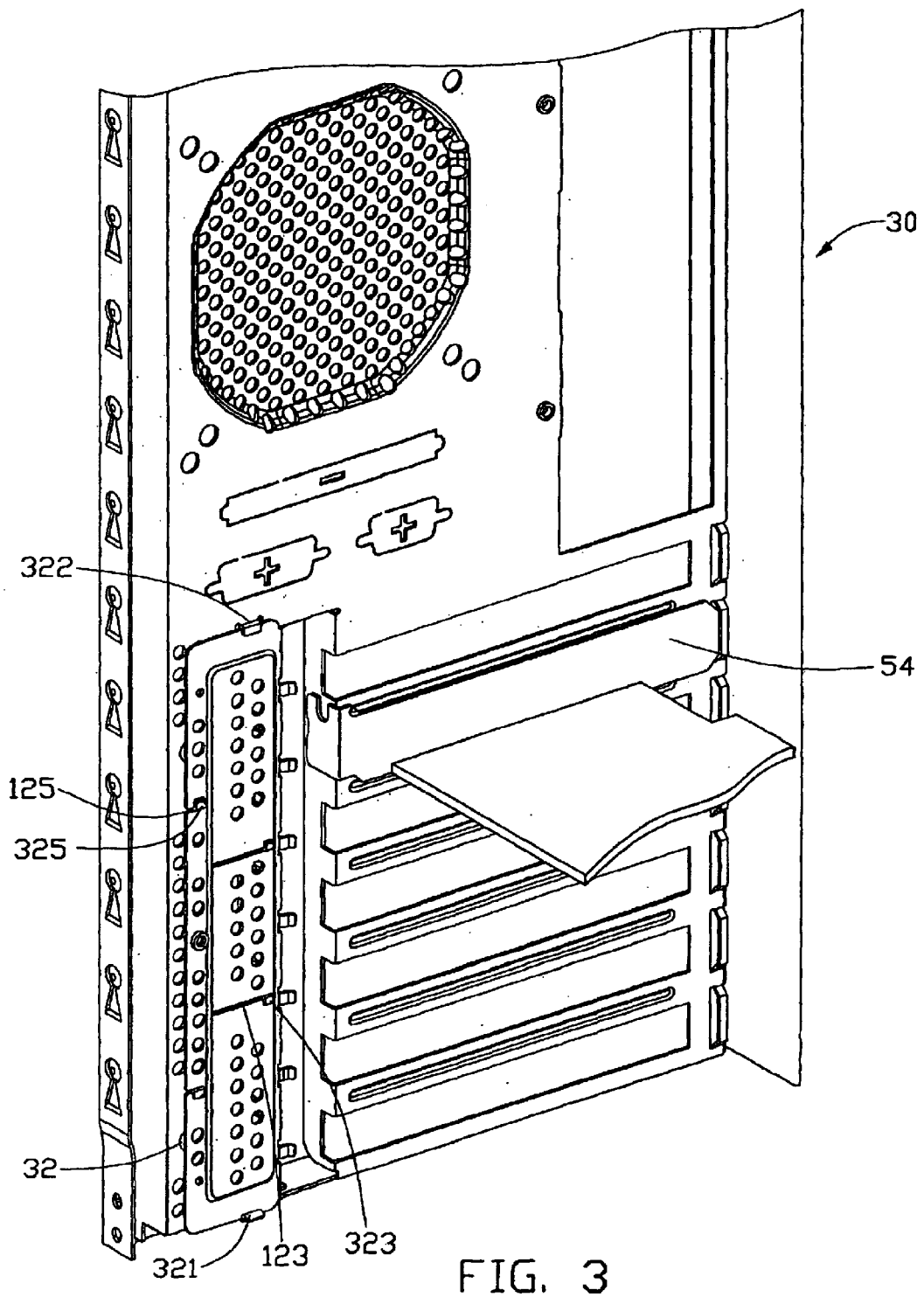
FIG. 3 is a partly assembled view of FIG. 1.
Figure 4:
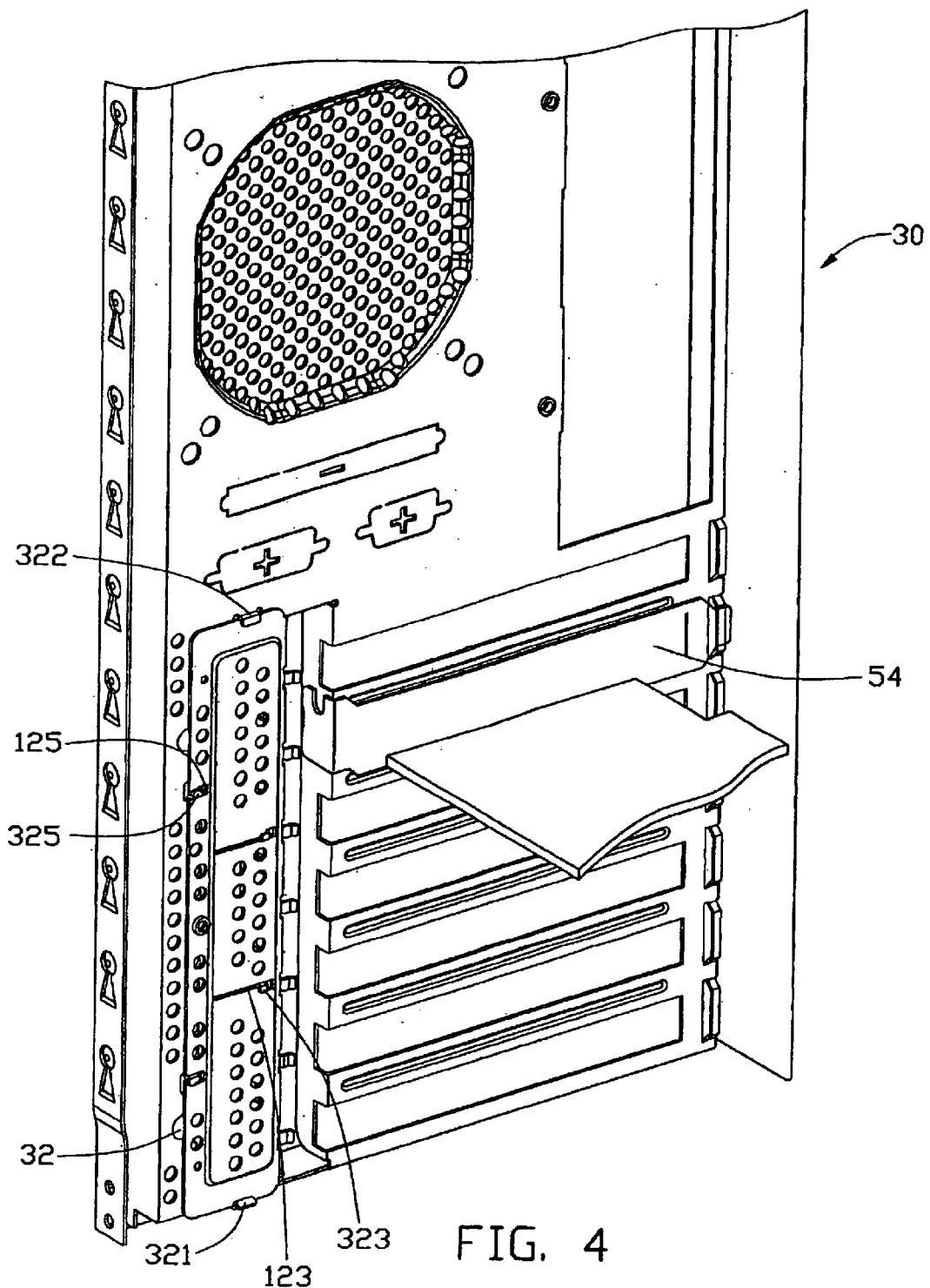
FIG. 4 is similar to FIG. 3, but showing the retention bracket securely attached to the rear panel.
Figure 5:
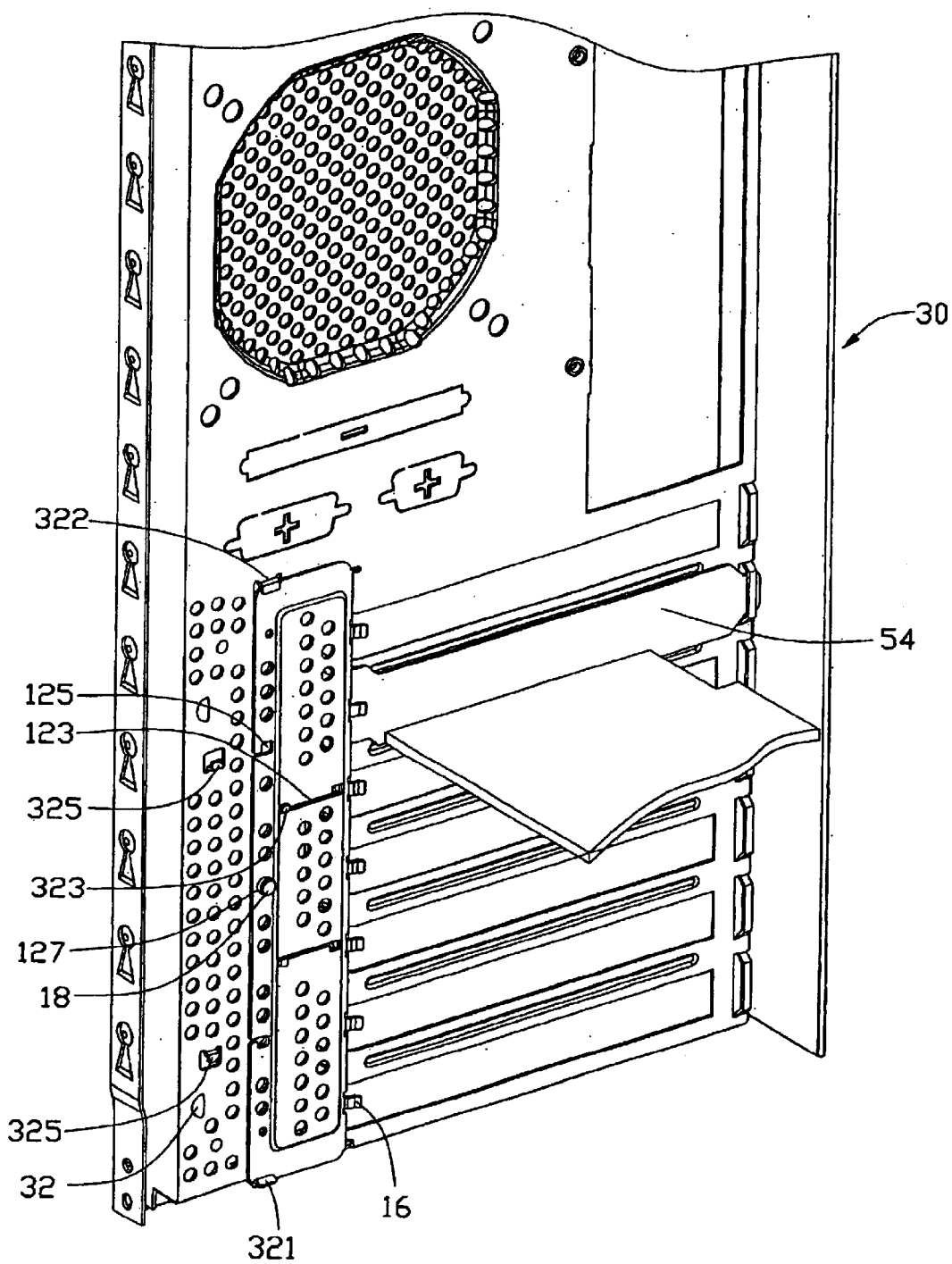
FIG. 5 is a fully assembled view of FIG. 1.
Figure 6:
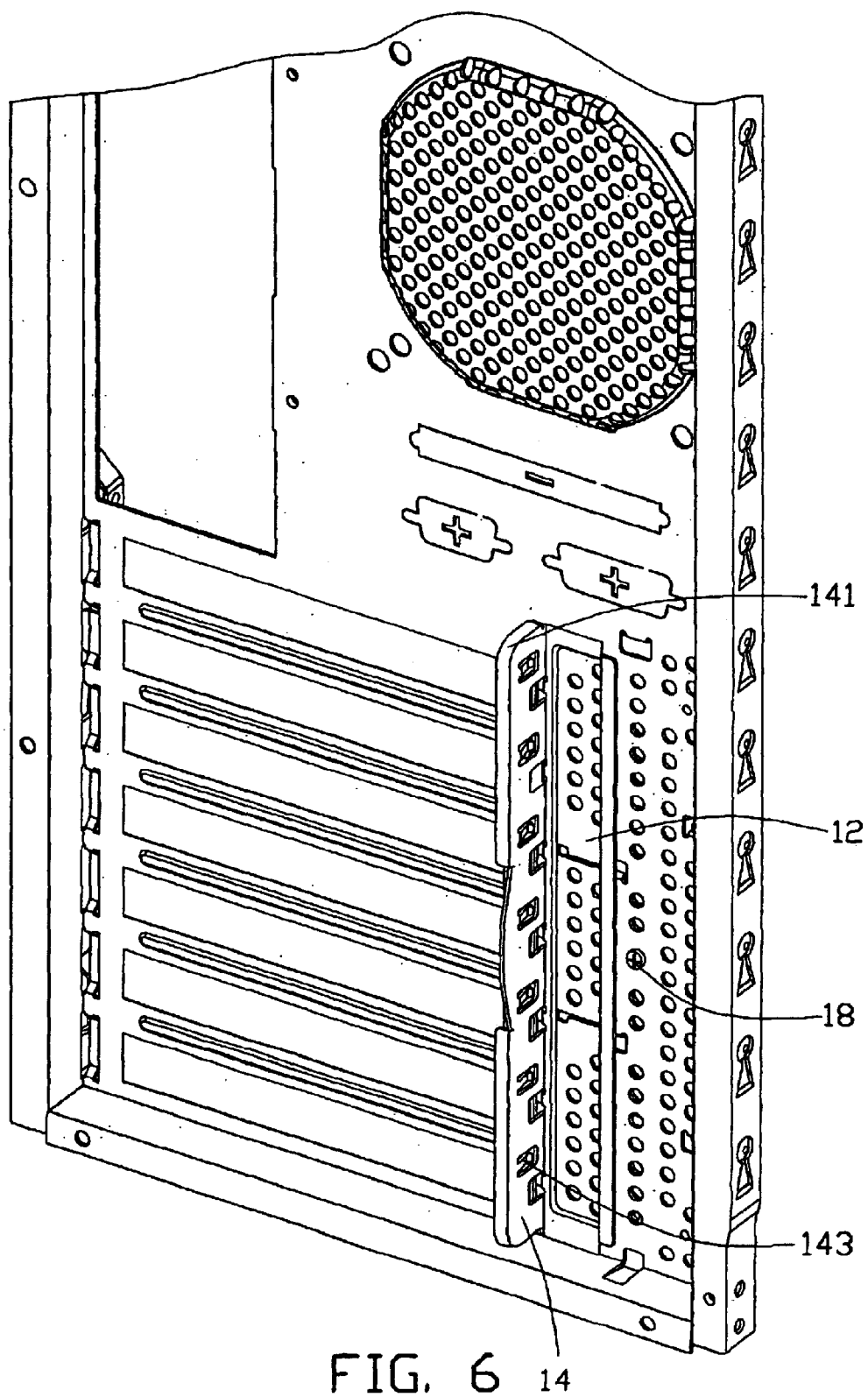
FIG. 6 is similar to FIG. 5, but viewed from another aspect.

Referring to FIGS. 1 and 2, a retention apparatus in accordance with the preferred embodiment of the present invention is provided for attaching at least one expansion card 50 in an enclosure of a computer system. The retention apparatus comprises a retention bracket 10, a thumbscrew 18 and a rear panel 30.

The retention bracket 10 is generally L-shaped, and comprises a first plate 12 and a second plate 14 extending substantially perpendicularly from the first plate 12. The first and second plates 12, 14 thus share a common edge. The first plate 12 forms a large shallow rectangular recessed portion in a direction generally away from the second plate 14. A pair of vertically spaced slots 123 is defined in the recessed portion of the first plate 12, each slot 123 comprising an entrance portion and a horizontal portion. A pair of vertically spaced openings 125 is defined in an edge portion of the first plate 12 distal from the common edge. Each opening 125 comprises an entrance portion and a horizontal portion. A socket 127 protrudes from said edge portion between the openings 125. The socket 127 has an internal thread. A plurality of ventilation holes is defined in the first plate 12. A narrow flange 141 extends perpendicularly from three free edges of the second plate 14. A plurality of spring fingers 143 is stamped in the second plate 14. A plurality of retention tabs 16 extends away from the common edge of the retention bracket 10. Each retention tab 16 has a curved portion near the common edge.

A vertical bent plate 34 is bent perpendicularly outwardly from a lower portion of the rear panel 30. A vertical entry slot 36 is thereby defined in the rear panel 30 adjacent the bent plate 34. A plurality of spaced parallel horizontal expansion slots 39 is defined in the lower portion of the rear panel 30, in communication with the entry slot 36. An elongated rib (not labeled) is outwardly formed on each of strip portions of the rear panel 30 that separate adjacent expansion slots 39, for reinforcing the strip portions. A plurality of retaining bridges 38 is inwardly formed from a side edge portion of the rear panel 30 distal from the bent plate 34, corresponding to the expansion slots 39. A plurality of air vents (not labeled) is defined in an air vent portion of the rear panel 30 adjacent the entry slot 36. A pair of vertically spaced protrusions 32 protrudes inwardly from a side section of said air vent portion distal from the entry slot 36. A resilient first hook 321 and a second hook 322 are inwardly stamped from the rear panel 30 at bottom and top extremities of the air vent portion respectively, adjacent the entry slot 36. The first hook 321 slants inwardly and slightly downwardly from the rear panel 30, and then bends perpendicularly inwardly. A pair of vertically spaced third hooks 323 is inwardly formed from the rear panel 30 between the air vent portion and the entry slot 36, being generally between the first and second hooks 321, 322. The third hooks 323 correspond to the slots 123 of the retention bracket 10. A pair of vertically spaced fourth hooks 325 is inwardly formed from the air vent portion, generally between the protrusions 32. The fourth hooks 325 correspond to the openings 125 of the retention bracket 10. Each of the second, third and fourth hooks 322, 323, 325 has an L-shaped profile.

The expansion card 50 comprises a printed circuit board 52 for insertion into an expansion slot connector of a motherboard (not shown) of the computer system, and a slot cover 54 perpendicularly disposed at an end edge of the printed circuit board 52. The slot cover 54 has a perpendicularly bent end portion 56.

Referring to FIGS. 3 to 6, in assembly and use of the retention apparatus, the retention bracket 10 is positioned at an inside of the rear panel 30 such that the second plate 14 extends through the entry slot 36. A top of the first plate 12 of the retention bracket 10 is engaged under the second hook 322, and a bottom of the first plate 14 urges the first hook 321 resiliently downwardly. The retention bracket 10 is thus clamped between the first and second hooks 321, 322. In this state, said distal edge portion of the first plate 12 of the retention bracket 10 partly covers the protrusions 32, and the third and fourth hooks 323, 325 are received in corresponding entrance portions of the slots 123 and the openings 125 of the retention bracket 10.

Then, the retention bracket 10 is slid toward the expansion slots 39. Said distal edge portion of the first plate 12 of the retention bracket 10 passes beyond the protrusions 32, and the third and fourth hooks 323, 325 move from the entrance portions of the slots 123 and the openings 125 to corresponding horizontal portions of the slots 123 and the openings 125 of the retention bracket 10. Said distal edge portion of the first plate 12 of the retention bracket 10 abuts the protrusions 32, thereby preventing of the third and fourth hooks 323, 325 from accidentally sliding back into the corresponding entrance portions of the retention bracket 10. Thus, the retention bracket 10 is removably attached to the inside of the rear panel 30, with the first and second hooks 321, 322 clamping the first plate 12 of the retention bracket 10 therebetween, and the third and fourth hooks 323, 325 being received in the corresponding horizontal portions of the slots 123 and the openings 125.

Then the expansion card 50 is attached to the motherboard (not shown) of the computer system. The expansion card 50 is positioned so that the slot cover 54 covers one of the expansion slots 52, the end portion 56 of the slot cover 54 abuts the bent plate 34 of the rear panel 30, and an opposite end of the slot cover 54 is received in a corresponding retaining bridge 38.

The retention bracket 10 is then slid toward the expansion card 50, until the second plate 14 of the retention bracket 10 abuts the end portion 56 of the expansion card 50. During said sliding, the third and fourth hooks 323, 325 slide in the corresponding horizontal portions of the slots 123 and the openings 125, until the fourth hooks 325 exit the openings 125 and the third hooks 323 reach inmost ends of the slots 123. A corresponding spring finger 143 of the second plate 14 cooperates with the bent plate 34 of the rear panel 30 to sandwich the end portion 56 of the expansion card 50 therebetween, for preventing movement of the expansion card 50 in horizontal directions parallel to the rear panel 30. A corresponding retention tab 16 of the retention bracket 10 abuts an inside of the slot cover 54 near the end portion 56, for preventing movement of the expansion card 50 in directions perpendicular to the rear panel 30. In this state, the flange 141 of the retention bracket 10 encloses three free edges of the bent plate 34 of the rear panel 30. The thumbscrew 18 is extended through a corresponding air vent and engaged in the socket 127 of the retention bracket 10. The expansion card 50 is thus securely attached to the rear panel 30. In this state, the retention bracket 10 is in a locked position.

To remove the expansion card 50 from the rear panel 30, the thumbscrew 18 is firstly unscrewed from the socket 127 of the retention bracket 10. The retention bracket 10 is slid away from the bent plate 56 of the expansion card 50. The expansion card 50 is then readily detached from the rear panel 30.

Although only one expansion card 50 has been described above, the retention apparatus of the present invention is equally capable of mounting a plurality of expansion cards 50 at the same time.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A retention apparatus for attaching expansion cards in a computer enclosure, each of the expansion cards comprising a slot cover, the retention apparatus comprising:
   a panel defining a plurality of expansion slots corresponding to the expansion cards, at least one pair of hooks arranged at an inside of the panel;
   a retention bracket attached between the hooks of the panel and being movable in a first direction parallel to the expansion slots while fixed in a second direction perpendicular to the expansion slots and the panel, the retention bracket comprising a first plate and a second plate joined at a common edge, a plurality of retention tabs extending from the retention bracket corresponding to the expansion slots for engaging with the slot covers to restrict movement of the expansion cards in a direction perpendicular to the panel, the second plate abutting the slot covers to restrict movement of the expansion cards in a direction parallel to the panel when the retention bracket is in a locked position; and
   attaching means for detachably attaching the retention bracket to the panel when the retention bracket is in the locked position.

2. The retention apparatus as claimed in claim 1, wherein an elongated rib is formed on each of strip portions of the panel that separate adjacent expansion slots, for reinforcing the strip portions.

3. The retention apparatus as claimed in claim 2, wherein a plurality of retaining bridges is formed from a side edge portion of the panel, fix receiving corresponding ends of the slot covers.

4. The retention apparatus as claimed in claim 1, wherein the pair of hooks comprises first and second hooks, tho first hook is formed from a bottom of the panel, and the first hook is resilient for facilitating receipt of the retention bracket between the first and second hooks.

5. The retention apparatus as claimed in claim 4, wherein the panel further comprises a pair of L-shaped third hooks near the entry slot, and a pair of slats is defined in the first plate of the retention bracket receiving the third hooks therein respectively.

6. The retention apparatus as claimed in claim 5, wherein a plurality of spaced protrusions is arranged adjacent a side edge of the panel, for preventing displacement of the retention bracket.

7. The retention apparatus as claimed in claim 6, wherein when the retention bracket is slid any from the slot covers, the protrusions engage with the first plate, for preventing the third hooks from exiting corresponding slots.

8. The retention apparatus as claimed in claim 7, wherein the panel further comprises a pair of L-shaped fourth hooks adjacent the protrusions, and a pair of spaced openings is defined in an edge portion of the first plate distal from the common edge corresponding to the fourth hooks.

9. The retention apparatus as claimed in claim 1 wherein the attaching means comprises a socket, a hole and a thumbscrew, the socket is arranged on the first plate of the retention bracket, the hole is defined in the panel, and the thumbscrew is extended through the hole and engaged in the socket when the retention bracket is in the locked position.

10. The retention apparatus as claimed in claim 1, wherein a plurality of spring fingers is provided at the second plate of the retention bracket corresponding to the expansion slots of the panel, for engaging with the slot covers of the expansion cards respectively.

11. A retention apparatus assembly comprising:
   a plurality of expansion cards each comprising a slot cover;
   a panel, a bent plate being formed from the panel, a plurality of expansion slots being defined in the panel and receiving the slot covers of the expansion cards respectively, an entry slot defined in the panel adjacent the bent plate;
   a retention bracket slidably attached to the panel, the retention bracket comprising a first plate slidable along the panel in a direction parallel to the expansion slots between a locked position and an unlocked position, and a second plate, and a plurality of retention tabs arranged on the retention bracket corresponding to the expansion cards; and
   fastening means;
   whereby when the retention bracket is located at the locked position the second plate of the retention bracket and the bent plate of the panel sandwich the slot covers of the expansion cards therebetween, the retention tabs hold the slot covers in place, and the fastening means fixedly attaches the retention bracket to the panel, and when the retention bracket is located at the unlocked position the second plate and the retention tabs are moved away from the slot covers.

12. The retention apparatus assembly as claimed in claim 11, wherein a plurality of hooks is arranged on a portion of the panel adjacent the entry slot, and the first plate of the retention bracket defines a plurality of slots parallel to the expansion slots, the slots of the retention bracket slidably receiving the hooks therein respectively.

13. The retention apparatus assembly as claimed in claim 12, wherein each of the slots of the retention bracket comprises an entrance portion in which a corresponding hook is received, and a horizontal portion communicating with the entrance portion for sliding of the corresponding hook therealong.

14. The retention apparatus assembly as claimed in claim 13, wherein a plurality of spaced protrusions is arranged adjacent a side edge of the panel and abuts the first plate in the unlocked position, for preventing the corresponding hooks from moving back to the entrances and exiting the corresponding slots.

15. The retention apparatus assembly as claimed in claim 12, wherein the fastening means comprises a socket arranged on the first plate of the retention bracket, a hole defined in said portion of the panel, and a thumbscrew, and the thumbscrew is extended trough the hole and engaged in the socket when the retention bracket is in the locked position.

16. A retention apparatus assembly comprising:

at least one expansion card with a corresponding slot cover thereon;

a panel of a computer enclosure defining a plurality of elongated expansion slots extending along a horizontal direction in said panel and in a front-to-back direction, perpendicular to said horizontal direction, through the panel, an entry slot extending along a lengthwise direction perpendicular to both said horizontal direction and said front-to-back direction, said entry slot located beside said expansion slots;

an outward support plate integrally extending perpendicularly along an edge of the entry slot in said front-to-back direction adjacent to said expansion slots; and a bracket having an L-shaped cross-sectional configuration thereof and including first and second plates perpendicular to each other, said first plate dimensioned to be large enough to cover the entry slot and said second plate dimensioned to e large enough to be sufficiently seated upon the support plate while be small enough to be allowed to extend through said entry slot;

means formed on both said bracket and said panel to restrictively guide movement of the bracket relative to the panel along the horizontal direction; wherein said bracket approaches the panel at an outer position relatively far from the expansion slots and moves toward the panel in the front-to-back direction from an inner side of the panel with the second plate extending through the entry slot, and successively moves in the horizontal direction toward the expansion slots under restrictive guidance by said means until reaches an inner position where the second plate cooperates with the support plate to sandwich the slot cover therebetween.

* * * * *